(12) United States Patent
Lu et al.

(10) Patent No.: US 8,223,571 B2
(45) Date of Patent: Jul. 17, 2012

(54) GENERATING AND AMPLIFYING DIFFERENTIAL SIGNALS

(75) Inventors: Chung-Ji Lu, Fongyuan (TW); Hung-Jen Liao, Hsinchu (TW); Cheng Hung Lee, Hsinchu (TW); Derek C. Tao, Fremont, CA (US); Annie-Li-Keow Lum, San Jose, CA (US); Hong-Chen Cheng, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 181 days.

(21) Appl. No.: 12/839,575

(22) Filed: Jul. 20, 2010

(65) Prior Publication Data

US 2012/0020176 A1    Jan. 26, 2012

(51) Int. Cl.
*G11C 7/02* (2006.01)
(52) U.S. Cl. ........... 365/207; 365/185.1; 365/185.21; 365/185.26
(58) Field of Classification Search .......... 365/207, 365/185.1, 185.21, 185.26
See application file for complete search history.

(56) References Cited

U.S. PATENT DOCUMENTS

| | | | | |
|---|---|---|---|---|
| 5,898,611 A * | 4/1999 | Yamada | ............ | 365/154 |
| 6,347,059 B2 * | 2/2002 | Bohm et al. | ............ | 365/210.12 |
| 6,829,171 B2 * | 12/2004 | Ooishi | ............ | 365/185.21 |
| 6,930,516 B2 * | 8/2005 | Gabara | ............ | 327/51 |
| 7,751,251 B2 * | 7/2010 | Bauer | ............ | 365/185.21 |

* cited by examiner

*Primary Examiner* — Pho M Luu
(74) *Attorney, Agent, or Firm* — Lowe Hauptman Ham & Berner, LLP

(57) ABSTRACT

A circuit includes a first left transistor having a first left drain, a first left gate, and a first left source; a second left transistor having a second left drain, a second left gate, and a second left source; a third left transistor having a third left drain, a third left gate, and a third left source; a first right transistor having a first right drain, a first right gate, and a first right source; a second right transistor having a second right drain, a second right gate, and a second right source; a third right transistor having a third right drain, a third right gate, and a third right source; a left node electrically coupling the first left drain, the second left drain, the second left gate, the third right gate, and the third left drain; and a right node electrically coupling the first right drain, the second right drain, the second right gate, the third left gate, and the third right drain.

20 Claims, 2 Drawing Sheets

GENERATING AND AMPLIFYING DIFFERENTIAL SIGNALS

TECHNICAL FIELD

The present disclosure is generally related to generating and amplifying a differential signal.

BACKGROUND

Single-ended data sensing is commonly used in memory arrays in which a memory cell (e.g., a transistor) is coupled to a capacitor and a bit line. The memory cell, when being invoked for reading, is required to discharge the bit line capacitance in a certain time period (e.g., an evaluation period before reading). For example, in some approaches, the memory cell is required to discharge (e.g., to pull the voltage level of) the bit line from the operation voltage Vdd to below the trip-point voltage of an inverter in the next reading stage. The evaluation period is the time it takes for the memory to discharge. The trip-point voltage is the voltage at which the inverter changes its state. Accurately reading the data, in effect, depends on the strength (e.g., the current driving/pulling capabilities) of the memory cell. In many applications (e.g., in high density memory arrays with multi-million memory cells/bits), the memory cell is inherently very small with low current driving capabilities (e.g., in the range of 20-30 μA). In some approaches, when the evaluation period is short and/or the current of the memory cell is weak, e.g., due to a weak cell, in a leakage process, or when the operation voltage is low (e.g., at the minimum required operation voltage (Vccmin) applications), the memory cell cannot completely discharge the bit line to the required voltage within the evaluation period, which results in incorrect read data.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
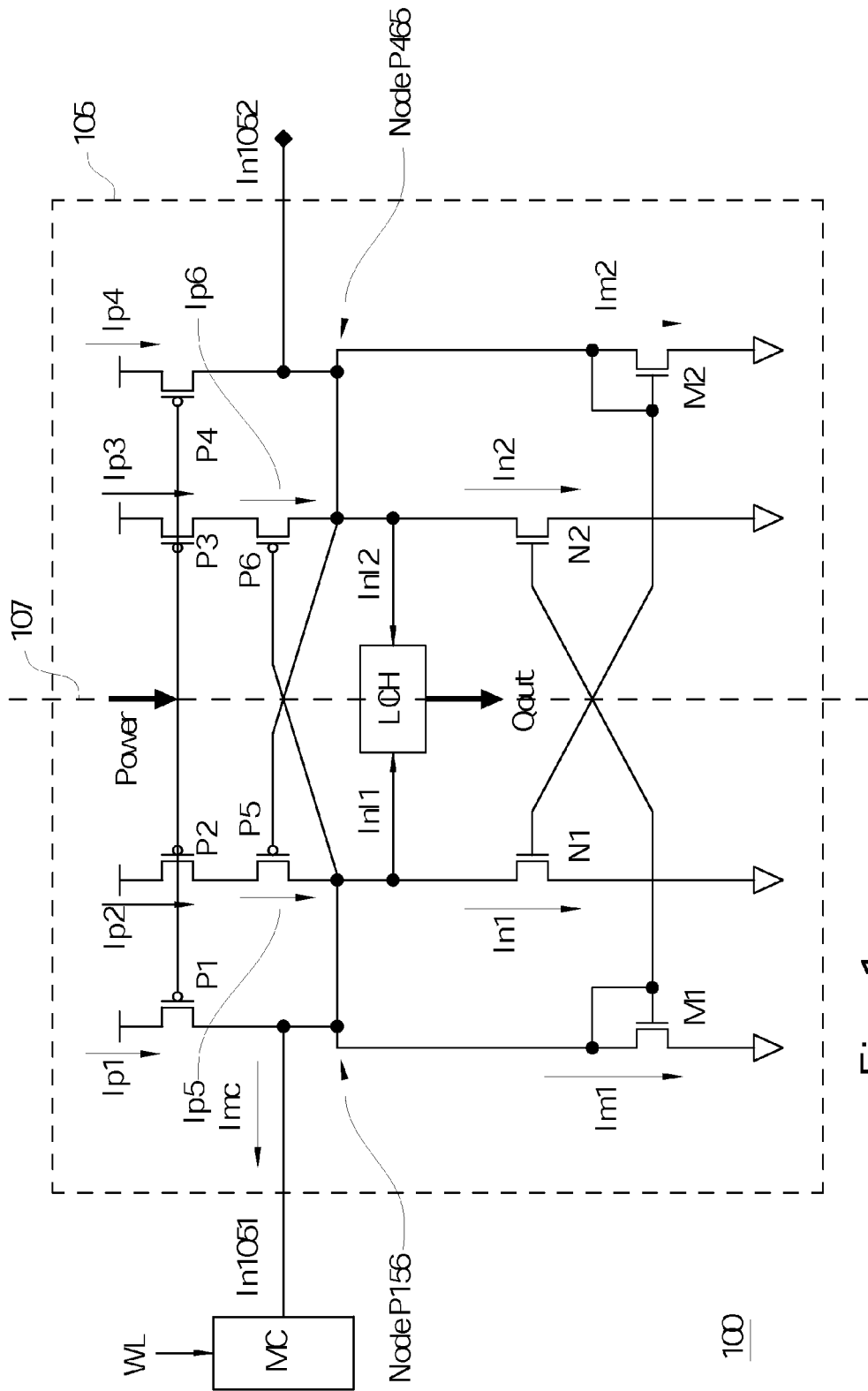
FIG. 1 is a circuit in accordance with some embodiments.

Embodiments, or examples, illustrated in the drawings are now being disclosed using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments can have one or a combination of the following features and/or advantages. Some embodiments related to memory arrays sense data faster and independent of the cell current, especially when the current is limited, e.g., in a leakage process, due to a weak bit or in a low voltage (e.g., Vccmin) operation. Some embodiments can be used in short evaluation periods in which a weak device generates a low current level to discharge the loading capacitance and/or in conjunction with an adjustable delay circuit to synchronize with a word line time window. Some embodiments can use a short recovery time. Some embodiments can be used in low power (e.g., ultra low power (ULP)) environments and/or with high density arrays (e.g., arrays having long bit lines coupling a plurality of small memory cells). Some embodiments can be used when the memory cells (bits) are weak (e.g., the memory cells pull little current). Some embodiments can be used with low operation voltage (e.g., low Vccmin) in ROMS, one-port/two-port register files (1PRF, 2PRF), etc.

Exemplary Circuit

FIG. 1 is a diagram of a circuit 100 in accordance with some embodiments. Memory cell MC stores data. Word line WL turns on/off memory cell MC. When memory cell MC is turned off, i.e., circuit 105 is not affected by an external circuit/current, the voltage levels of nodes In11 and In12 are substantially equal (e.g., equal). In some embodiments, when memory cell MC is turned on, e.g., for reading data, a "read" transistor (e.g., a pull down transistors) in memory cell MC is turned on and sinks some current, a portion of current Ip1 in circuit 105 flows into memory cell MC as current Imc. As a result, circuit 105 is imbalanced, and a differential signal (e.g., signal In112, not labeled) is generated between nodes In11 and In12. Memory cell MC is shown coupled to input In1051 of circuit 105 for illustration, memory cell MC can be coupled to input In1052. In some embodiments, when an input (e.g., input In1052) not connected to memory cell MC, that input is connected to a reference voltage, a reference circuit, a de-activated memory cell, etc.

Recursive amplification circuit 105 is used with memory cell MC to read the data stored in memory cell MC independent of the current strength of memory cell MC. When memory cell MC is accessed, e.g., for reading, a part of current Ip1, i.e., current Imc, flows into memory cell MC resulting in a differential signal In112 between nodes In11 and In12. As soon as differential signal In112 is created (i.e., there is a voltage difference between nodes In11 and In12), circuit 105 "recursively" amplifies the voltage difference based on which latch LCH generates data on line Qout corresponding to the data stored in memory cell MC to be read.

Latch LCH, based on the voltage difference between nodes In11 and In12, generates a signal to be read on line Qout. In some embodiments, the larger the voltage difference between nodes In11 and In12, the easier it is for latch LCH to sense (e.g. read) the data. In some embodiments, when the voltage level of node In11 is higher than that of node In12, latch LCH generates a logical "1" (e.g., a High logic level) on line Qout, and when the voltage level of node In11 is lower than that of node In12, latch LCH generates a logical "0" (e.g., a Low logic level) on line Qout. Embodiments of the disclosure, however, are not limited to any particular set of data generated by latch LCH. For example, the embodiments are equally usable if latch LCH generates a Low when the voltage level of node In11 is higher than that of node In12, and generates a High when the voltage level of node In11 is lower than that of node In12, etc. Further, the embodiments are not limited to any particular method or mechanism based on which latch circuit LCH generates signal Qout based on the voltage difference between nodes In11 and In12. Various circuits generating signal Qout are within the scope of the embodiments.

Transistors P1, P2, P3, and P4 serve as power switches providing power (e.g., the respective currents Ip1, Ip2, Ip3, and Ip4) for circuit 105. Signal Power controls (e.g., turn on/off) transistors P1, P2, P3, and P4. In some embodiments, signal Power is synchronized with a word line (e.g., signal) WL (e.g., through an adjustable delay circuit) so that when signal WL is activated (e.g., driven High) that turns on memory cell MC signal Power is also activated (e.g., driven Low) to turn on transistors P1, P2, P3, and P4. When signal Power is driven High, transistors P1, P2, P3, and P4 are off, but when signal Power is driven Low, transistors P1, P2, P3, and P4 are on, and currents Ip1, Ip2, Ip3, and Ip4 flow. Transistors P5 and P6 are called voltage (or power) kick transistors because, in some embodiments, at some point during differential signal amplification one transistor (e.g., transistor P5) is off while the other transistor (e.g., transistor P6) is on that maximizes the amplification of differential signal In112. Transistors P1, P2, P3, P4 are shown for illustration, other circuitries providing powers/currents, including, for example, current sources, are within the scope of the disclosed embodiments. Additionally, a current source replacing operation voltage VDD for each transistor P1, P2, P3, and P4 and providing the corresponding current is within the scope of the disclosed embodiments.

Circuit 105 is symmetrical about the axis 107. That is, a transistor on the left of axis 107 is configured to match (e.g., to have the same size, the same current driving capability, etc., as those of) a transistor on the right of axis 107. For example, transistor P1 is configured to match transistor P4, transistor P2 is configured to match transistor P3, transistor P5 is configured to match transistor P6, transistor N1 is configured to match transistor N2, and transistor M1 is configured to match transistor M2, etc. Because of the symmetrical structure, when circuit 105 is not affected by an external circuit (e.g. memory cell MC), current, and/or voltage, a current generated by a transistor on the left of axis 107 is substantially the same as a current generated by a transistor on the right of axis 107. For simplicity, the term "the same" used in this document indicates "substantially the same." As a result, Ip1≅Ip4, Ip2≅Ip3, Ip5≅Ip6, In1≅In2, and Im1≅Im2. In FIG. 1, currents Ip1, Ip2, Ip3, Ip4, Ip5, and Ip6 flow from the sources to the drains of respective transistors P1, P2, P3, P4, P5, and P6. Similarly, currents In1, In2, Im1, and Im2 flow from the drains to the sources of respective transistors N1, N2, M1, and M2.

Node P156 couples the drains of transistors P1 and P5, the gate of transistor P6, the drain and the gate of transistor M1, and the gate of transistor N2. Similarly, node P465 couples the drains of transistors P4 and P6, the gate of transistor P5, the drain and the gate of transistor M2, and the gate of transistor N1.

Recursive Amplification

For illustration, signal WL is activated (e.g., driven High), which turns on memory cell MC. At about the same time, signal Power is also activated (e.g., driven Low) through, e.g., an adjustable delay circuit (not shown) synchronized with signal WL, which turns on transistors P1, P2, P3, and P4.

On the left side of axis 107, because transistor P1 is on, current Ip1 flows, and, because memory cell MC is on, memory cell MC (e.g., via a pull down device) sinks current Imc. As a result, current Ip1 is divided into (or is the sum of) currents Imc, Im1, and In1 (i.e., Ip1=Imc+Im1+In1). On the right side of axis 107, because transistor P4 is on, current Ip4 flows, which is divided into (or is the sum of) currents Im2 and In2 (i.e., Ip4=Im2+In2). Current Im1+In1 and current Im2+In2 are the net current flowing into transistors M1 and N1, and M2 and N2, respectively. Because Ip1=Ip4, Im1+In1=Ip1−Imc, and Im2+In2=Ip4, Im1+In1 is less than Im2+In2, which causes the voltage at node P156 or at node In11 is less than the voltage at node P465 or at node In12. Stated another way, a differential voltage In112 between nodes In11 and In12 is created wherein the voltage at node In11 is less than the voltage at node In12.

Because the voltage at node P156 is the same as the voltage at the gate of transistor N2 (e.g., voltage Vgm2, not labeled), which is less than the voltage at node P456, which is the same as the voltage at the gate of transistor N1 (e.g., voltage Vgm1, not labeled), transistor N2 is weaker than transistor N1. Consequently, current In2 is lesser than current In1. Because current In2 is lesser than current In1, current Im2 is greater than current Im1. As a result, transistor M2 is stronger than transistor M1, enabling transistor N1 to be stronger. Because transistor N1 competes for current provided to node P156 with transistor M1, as transistor N1 becomes stronger, transistor M1 becomes weaker. Further, as transistor N1 becomes stronger, transistor N1 further pulls down the voltage level at node P156 or node In11, and further increases the voltage difference between nodes In11 and In12.

Because transistor N1 is stronger than transistor N2, transistor N1 pulls the voltage at its drain (e.g., node In11) to it source (e.g., ground) stronger than transistor N2 pulls the voltage at its drain (e.g., node In12) to its source (e.g., ground). Consequently, the voltage level at node In12 is further higher than that at node In11. Stated another way, the differential signal In112 or the voltage difference between nodes In11 and In12 is further amplified (e.g., recursively amplified).

The Voltage Kick Mechanisms

Transistors P5 and P6 are called "voltage" kick transistors because, at an appropriate time, one transistor (e.g., transistor P5) is off while the other transistor (e.g., transistor P6) is on, maximizing the amplification of signal In112 (e.g., maximizing the voltage difference between nodes In11 and In12). In some embodiments, both transistors P5 and P6 are initially on when signal Power is driven Low. During this time, transistors P5 and P6 provide the respective currents Ip5 and Ip6 to the corresponding nodes P156 and P456.

Further, in the above example where memory cell MC is coupled to input In1051 of circuit 105, because the voltage level at node In11 (or node P156) is driven further and further (recursively) lower than that at node In12 (or at node P465), the voltage level at node P156 continues to keep transistor P6 on because transistor P6, a PMOS transistor, is turned on by a Low voltage applied at its gate. In contrast, the voltage at node P465 keeps rising and rising, and eventually reaches a point that it is high enough to turn off transistor P5 because transistor P5, a PMOS transistor, is turned off by a High applied at its gate. As the voltage at the gate of transistor P6 (e.g., node P156) keeps decreasing (e.g., lower and lower), current Ip6 keeps increasing and increasing. On the other hand, as the voltage at the gate of transistor P5 (e.g., at node P465) keeps increasing and increasing (e.g., higher and higher), current Ip5 keep decreasing and decreasing, resulting in current Im2+In2 being further greater than current Im1+In1. As a result, the voltage difference between nodes In11 and In12 is further amplified consistent with the above illustration until transistor P5 is turned off. Transistors P5 and P6 are shown for illustration, other mechanisms increasing the voltage difference between current Im2+In2 and Im1+In2 are within the scope of the disclosure.

In some embodiments, a predetermined differential signal In112 is calculated based on currents Imc, Ip1, Ip2, Ip3, Ip4, Ip5, Ip6, In1, In2, Im1, and Im2, each of which is calculated based on sizing the corresponding transistor. That is, the predetermined differential signal In112 (e.g., the voltage difference between nodes In11 and In12) is calculated by adjusting the size of one or a combination of the transistors P1, P2, P3, P4, P5, P6, N1, N2, M1, and M2. Because the voltage level of signal Power at the gate of transistors P1, P2, P3, and P4 also affect the amount/flow of currents Ip1, Ip2, Ip3, and Ip4, signal Power, in some embodiments, is also used in calculating and generating the differential signal In112 to correspond to the predetermined signal In112.

Circuit 105 used with memory cell MC as illustrated in FIG. 1 is for illustration, the disclosed embodiments are not limited to such a usage. Circuit 105 can be used in various other applications, including, for example, where a differential signal is desired, in a circuit that sinks or sources currents based on which a voltage level (e.g., a digital voltage level) is transformed, etc.

Some embodiments are advantageous over other approaches because circuit 105 in those embodiments does not depend on the current strength of memory cell MC. As soon as there is some circuit, current and/or voltage that causes an imbalance in circuit 105 (e.g., the memory cell MC is pulling current Imc, a differential signal pulling current from or injecting current into nodes In1051 and 1052, etc.), circuit 105 automatically generates and recursively amplifies differential signal In112. Further, circuit 105 does not have to wait for the whole evaluation for the required discharge to complete like other approaches. For example, memory cell MC can be turned off as soon as the differential signal In112 in circuit 105 is generated. Circuit 105 continues to amplify the differential signal In112 for latch LCH to read the data as appropriate. As a result, circuit 105 can be used in high density applications where the memory cell MC is tiny with ultra low current driving/pulling capabilities. Because circuit 105 does not depend on the discharge time like other approaches, circuit 105 also does not depend on the corresponding charge time.

Exemplary Method

Figure 2:
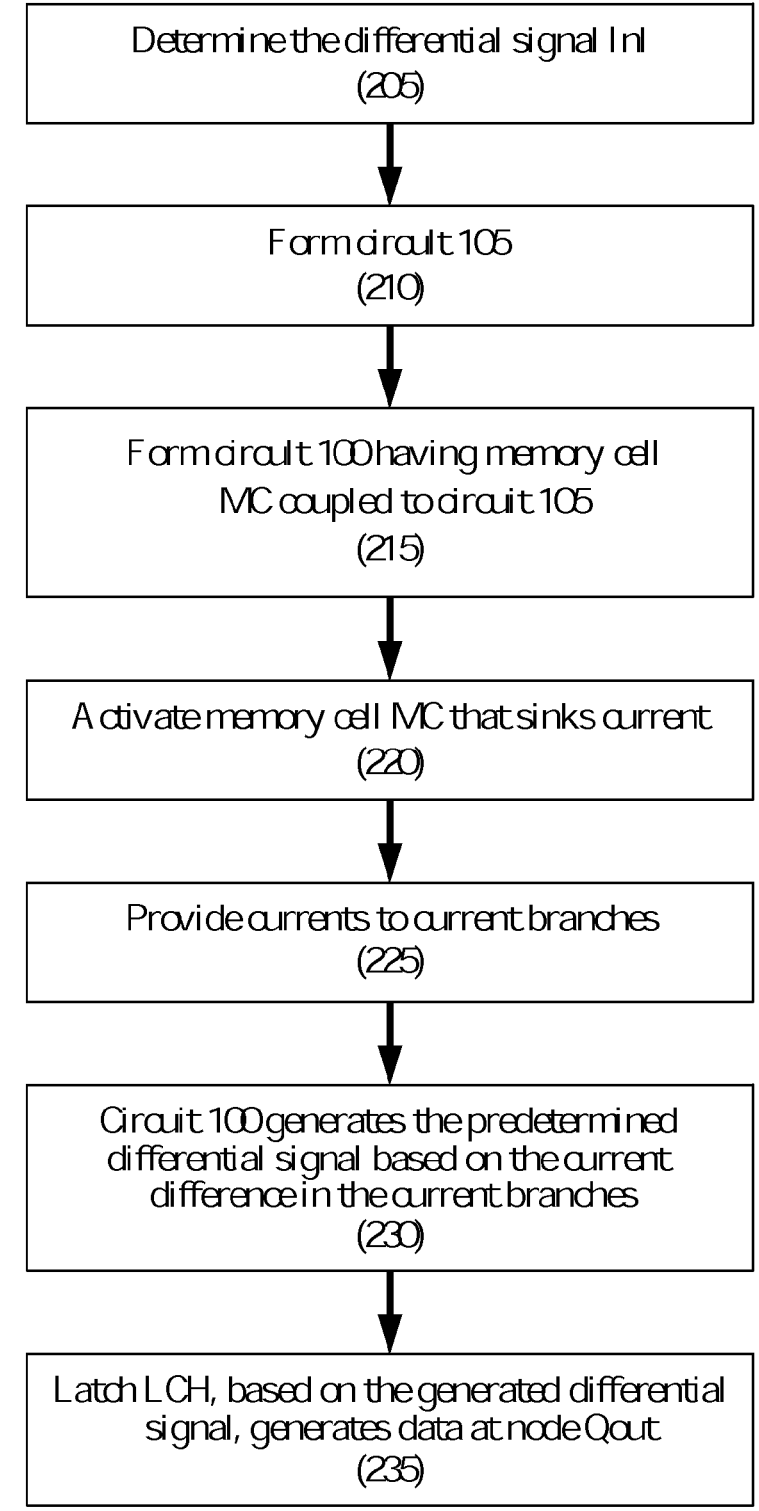
FIG. 2 is a flowchart illustrating an operation of the circuit in FIG. 1, in accordance with some embodiments.

FIG. 2 is a flowchart illustrating a method related to circuit 100, in accordance with some embodiments.

In step 205, the differential signal In112 (the voltage difference between nodes In11 and In12) is determined. In some embodiments, the required voltage difference of this differential signal depends on the sensing capability of latch circuit LCH. For illustration, the voltage level at node In11 is lower than the voltage level at node In12.

In step 210, circuit 105 is formed having a first current branch having current Im1, a second current branch having current In1, a third current branch having current Im2, and a fourth current branch having current In2.

In step 215, circuit 100 is formed where memory cell MC is coupled to input In1011 of circuit 105.

In step 220, a word line WL is activated to turn on memory cell MC, which sinks current Imc. Because memory cell MC sinks current Imc, the total current Im1+In1 is lesser than the total current Im2+Im1.

In step 225, currents are provided to the current branches by synchronizing signal Power with word line WL to turn on transistors P1, P2, P3, and P4.

In step 230, because of the current difference in current Im1+In1 and Im2+In2, circuit 105 generates and amplifies differential signal In112 in which current Im1 is lesser than current Im2 and current In1 is greater than current In2.

In step 235, latch LCH, based on the differential signal In112, generates the data at node Qout that reflects the data stored in memory cell MC.

In the above example, because memory cell MC is coupled to input In1051 the voltage level of node In11 is lower than that of node In12. If, however, memory cell MC is coupled to node In1052, the voltage level of node In11 is higher than that of node In12, or latch LCH would generate output Qout with an inverse logic. Further, memory cell MC is used to sink current Imc causing the imbalance (e.g., current difference) in circuit 105 for differential signal In112 to be generated. Other circuitry/signal (e.g., a differential signal at nodes In1051 and In1052) causing a current imbalance in circuit 105 can equally be used to generate differential signal In112 based on which circuit 105 further amplifies differential signal In112.

A number of embodiments have been described. It will nevertheless be understood that various modifications may be made without departing from the spirit and scope of the disclosed embodiments. For example, the various transistors being shown as a particular dopant type (e.g., NMOS (N-type Metal-Oxide Silicon) and PMOS (P-type Metal Oxide Silicon)) are for illustration, embodiments of the disclosure are not limited to a particular type, but the dopant type selected for a particular transistor is a design choice and is within the scope of embodiments. The logic level (e.g., Low or High) of the various signals used in the above description is also for illustration purposes, embodiments are not limited to a particular level when a signal is activated and/or deactivated, but, rather, selecting such a level is a matter of design choice.

The above method embodiment shows exemplary steps, but they are not necessarily performed in the order shown. Steps may be added, replaced, changed order, and/or eliminated as appropriate, in accordance with the spirit and scope of the disclosed embodiments.

Each claim of this document constitutes a separate embodiment, and embodiments that combine different claims and/or different embodiments are within scope of the disclosure and will be apparent to those of ordinary skill in the art after reviewing this disclosure.

What is claimed is:

1. A circuit comprising:
a first left transistor having a first left drain, a first left gate, and a first left source;
a second left transistor having a second left drain, a second left gate, and a second left source;
a third left transistor having a third left drain, a third left gate, and a third left source;
a first right transistor having a first right drain, a first right gate, and a first right source;
a second right transistor having a second right drain, a second right gate, and a second right source;
a third right transistor having a third right drain, a third right gate, and a third right source;
a left node electrically coupling the first left drain, the second left drain, the second left gate, the third right gate, and the third left drain; and
a right node electrically coupling the first right drain, the second right drain, the second right gate, the third left gate, and the third right drain; the first left source, the second left source, the third left source, the first right source, the second right source, and the third right source serving as current paths for the circuit.

2. The circuit of claim 1 further comprising:
a memory cell coupled to the left node or the right node and configured to cause a differential signal between the left node and the right node; and a first circuit electrically coupled to the left node and the right node, and configured to read data stored in the memory cell based on the differential signal.

3. The circuit of claim 2 wherein the memory cell is configured to draw current from the circuit to cause the differential signal.

4. The circuit of claim 1 wherein the left node and the right node are configured to receive a differential signal at the first node and the second node, the circuit amplifying the differential signal resulting in an amplified differential signal at the first node and the right node.

5. The circuit of claim 1 wherein one or a combination of the first left source and the first right source is electrically coupled to a power node or a current source.

6. The circuit of claim 1 further comprising:
a fourth left transistor having a fourth left drain, a fourth left gate, and a fourth left source; and
a fourth right transistor having a fourth right drain, a fourth right gate, and a fourth right source;
wherein
the fourth left drain and the fourth right gate are electrically coupled to the left node; and
the fourth right drain and the fourth left gate are electrically coupled to the right node.

7. The circuit of claim 6 further comprising:
a fifth left transistor having a fifth left drain, a fifth left gate, and a fifth left source; and
a fifth right transistor having a fifth right drain, a fifth right gate, and a fifth right source;
wherein
the fourth left source is electrically coupled to the fifth left drain;
the fourth right source is electrically coupled to the fifth right drain; and
one of a combination of the fifth left source and the fifth right source is coupled to a power node or a current source.

8. The circuit of claim 1 wherein the first left transistor and the first right transistor are PMOS, the second left transistor, the second right transistor, the third left transistor, and the third right transistors are NMOS.

9. A circuit comprising:
a first left transistor having a first left drain, a first left gate, and a first left source;
a second left transistor having a second left drain, a second left gate, and a second left source;
a first right transistor having a first right drain, a first right gate, and a first right source;
a second right transistor having a second right drain, a second right gate, and a second right source;
a left node; and
a right node;
wherein
the left node electrically couples the first left drain, the first left gate, the second right gate, and the second left drain;
the right node electrically couples the first right drain, the first right gate, the second left gate, and the second right drain;
the first left source, the second left source, first right source, and the second right source serve as current paths for the circuit; and
a left voltage at the left node and a right voltage at the right node constitute a differential signal when a left current flowing into the left node is different from a right current flowing into the right node.

10. The circuit of claim 9 wherein the first left transistor, the first right transistor, the second left transistor, and the second right transistor are NMOS.

11. The circuit of claim 9 further comprising:
a third left transistor having a third left drain, a third left gate, and a third left source;
a third right transistor having a third right drain, a third right gate, and a third right source;
wherein the third left drain and the third right gate and are electrically coupled to the left node and the third right drain and the third left gate are electrically coupled to the right node.

12. The circuit of claim 11 wherein one or a combination of the third left source and the third right source is electrically coupled to a drain of a fourth transistor or a current source.

13. The circuit of claim 9 wherein one or a combination of the first node and the second node is electrically coupled to a current source or a transistor providing a current.

14. A method comprising:
using a first node electrically coupling a first first current branch having a first first current and a first second current branch having a first second current as a first terminal for a differential signal;
using a second node electrically coupling a second first current branch having a second first current and a second second current branch having a second second current as a second terminal for the differential signal;
injecting a first current to the first node and a second current to the second node; the first current and the second current having a current difference; and
in response to the current difference, causing the first first current to be lesser than the second first current and the first second current to be greater than the second second current, thereby creating the differential signal having a voltage difference in the first terminal and the second terminal.

15. The method of claim 14 further comprising:
using in the first first current branch a first first transistor having a first first drain, a first first gate, and a first first source;
using in the first second current branch a first second transistor having a first second drain, a first second gate, and a first second source;
using in the second first current branch a second first transistor having a second first drain, a second first gate, and a second first source;
using in the second second current branch a second second transistor having a second second drain, a second second gate, and a second second source;
electrically coupling the first node to the first first drain, the first first gate, and the second second gate; and
electrically coupling the second node to the second first drain, the second first gate, and the first second gate.

16. The method of claim 14 further comprising using a first transistor or a first current source to generate the first current and a second transistor or a second current source to generate the second current.

17. The method of claim 14 further comprising causing additional current difference in the first current and the second current to increase the voltage difference in the first terminal and the second terminal, by coupling a gate of a first transistor to the first terminal and coupling a gate of a second transistor to the second terminal.

18. The method of claim 17 further comprising using a first circuit to provide current to the first transistor and using a second circuit to provide current to the second transistor.

19. The method of claim 18 further comprising using one or a combination of a transistor and a current source to form one or a combination of the first circuit and the second circuit.

20. The method of claim 14 further comprising determining the voltage difference based on one or a combination of the first first current, the first second current, the second first current, the second second current, and the current difference.

* * * * *